(12) United States Patent
Foye

(10) Patent No.: US 6,266,250 B1
(45) Date of Patent: Jul. 24, 2001

(54) ELECTRONICS COMPONENT MOUNTING SYSTEM

(75) Inventor: Richard T. Foye, Fullerton, CA (US)

(73) Assignee: Multiplex Technology, Inc., Brea, CA (US)

( * ) Notice: Subject to any disclaimer, the term of this patent is extended or adjusted under 35 U.S.C. 154(b) by 0 days.

(21) Appl. No.: 09/558,639

(22) Filed: Apr. 26, 2000

(51) Int. Cl.[7] ...................................................... H05K 7/02
(52) U.S. Cl. .................. 361/760; 211/41.17; 211/88.01; 211/90.02; 211/94.02; 248/231.9; 248/220.21; 248/220.22; 248/220.31; 248/224.7; 248/225.11; 248/222.41
(58) Field of Search ..................................... 361/726, 740, 361/759, 807, 810, 760; 248/231.9, 220.21, 220.22, 220.31, 224.7, 225.11, 222.41; 211/26, 41.17, 88.01, 90.02, 94.02

(56) References Cited

U.S. PATENT DOCUMENTS

| | | | |
|---|---|---|---|
| 5,295,041 | * | 3/1994 | Metivier et al. ...................... 361/622 |
| 5,405,111 | | 4/1995 | Medlin, Jr. . |
| 5,407,160 | | 4/1995 | Hollingsworth et al. . |
| 5,482,232 | | 1/1996 | Wynn et al. . |
| 5,738,020 | * | 4/1998 | Correia ................................... 109/51 |
| 6,036,517 | * | 3/2000 | Byrne ................................... 439/215 |
| 6,074,247 | | 6/2000 | Hall et al. . |

* cited by examiner

*Primary Examiner*—Jeffrey Gaffin
*Assistant Examiner*—Thanh Y. Tran
(74) *Attorney, Agent, or Firm*—Lynn & Lynn

(57) ABSTRACT

This invention is a modular electronics mounting system according that is easy to install and that can be used with a wide variety of electronics components. A support plate includes a grid of holes arranged in at least one pair of columns spaced apart by a selected distance. The holes in each of the columns are spaced apart by a predetermined interval. The support plate is configured to be mounted to a wall such that the grid is spaced apart from the wall. A module formed generally as a plate such that an electronic component may be mounted thereto. The module includes a pair of hooks extending from a first edge of the plate. The hooks are spaced apart by the column spacing such that the hooks may be arranged to extend through first and second holes in the grid. A locking pin extends from the module such that the locking pin extends into a corresponding third hole in the grid to restrain the module against movement parallel to the support plate. The module further includes a passage that is aligned with a fourth hole in the grid when the hooks and locking pin are in their respective holes. The invention further includes a locking pin configured for insertion into the passage and through the fourth hole in the grid, the locking pin being arranged to restrain the module against movement away from the support plate.

7 Claims, 3 Drawing Sheets

ELECTRONICS COMPONENT MOUNTING SYSTEM

BACKGROUND OF THE INVENTION

This invention relates generally to apparatus for mounting electronics components and particularly to apparatus for mounting components in a home system electronics system.

Modular electronics has long had a requirement to mount different products (often from different manufactures) in close proximity to one another. The classic example of this is the telephone 19" rack. This standard (EIA-1310) allows arbitrary electronic pieces to be mounted in a vertical rack, so long as they adhere to the width requirements and the location of mounting holes. The heights may vary by increments of 1.75". This standard has long fulfilled the needs of telephone companies, cable companies, and electronic instrument manufactures. However, the size and inherent cost of this system restricts it to commercial use in an open room.

The size issue was directly addressed by the DIN-rail mounting system. Featureless rails mount modular electronics side by side. Designed for use inside machine tools, this standard has the positive attributes of excellent modularity and inherent low cost of the rail. The disadvantages of DIN-rail mounts are the complexity of the latch on the electronics and a rather narrow support area. For attaching wires to screw terminals, this is not a problem. but the support is insufficient for using telephone type punch-down tools. The force of the tool to push wires into insulation-displacement connectors and then cut the excess wire is quite high.

A home system must be part of the home's infrastructure. It must accommodate a variety of mounting environments. An enclosure that may be surface mounted in an attic or basement can have an almost arbitrary size and shape. However, in many places, being built-in means being inside a wall. The most common construction that must be accommodated is that of 2×4 vertical studs placed on 16" centers. To be mounted in this type of wall makes restrictions on width and depth of the enclosure and subsequently on the electronics inside.

Home system electronics is an area that needs an appropriate mounting solution. "Structured wiring" systems are just now making changes to how homes are wired. These systems have all of the communication wiring in a home terminate in a single "service center" enclosure. This includes telephone wiring, TV coax, speaker wiring and now data wiring. These wires run from various rooms in the house and are to be terminated at connectors or electronic devices inside this enclosure. If terminated at a connector, the wires may then be jumpered or cross-connected to different devices. For example, a wall-plate in a bedroom may have an RJ45 connector on it and CAT-5 cable running back to a similar RJ45 connector inside the service center. Now, by jumpering from the service center connector to the appropriate device, an installer may turn that bedroom jack into a telephone port, an Ethernet port for the home data network, or a high-speed Internet access port, such as DSL or ISDN. Future services will deliver entertainment digitally. A jack may have a telephone connected today and a television in five years. In a structured wiring system, the personality of the house wiring may be changed by adding electronics and changing the jumpers. A mechanical mounting system is needed to allow this ability to change.

SUMMARY OF THE INVENTION

Accordingly, this invention provides a home system electronics component mounting system that overcomes the deficiencies of the prior art. The electronics mounting system according to the present invention provides an inexpensive modular apparatus that is easy to install and that can be used with a wide variety of electronics components.

Apparatus according to the present invention for mounting an electronic component to a wall of a structure such as a home or an office, comprises a support plate that includes a grid of holes therein. The grid is formed to have a pair of columns of the holes with the columns being spaced apart by a selected distance. The holes in each of the columns are spaced apart by a predetermined interval. The support plate is configured to be mounted to a wall such that the grid is spaced apart from the wall.

The apparatus according to the present invention further includes a module formed generally as a plate such that an electronic component may be mounted thereto. The module includes a pair of hooks extending from a first edge of the plate. The hooks are spaced apart by the column spacing such that the hooks may be arranged to extend through first and second holes in the grid. A locking pin extends from the module such that the locking pin extends into a corresponding third hole in the grid to restrain the module against movement parallel to the support plate. The module further includes a passage that is aligned with a fourth hole in the grid when the hooks and locking pin are in their respective holes. The invention further includes a locking pin configured for insertion into the passage and through the fourth hole in the grid, the locking pin being arranged to restrain the module against movement away from the support plate.

The apparatus according to the present invention may further comprise a second pair of columns of holes formed in the support plate. The second pair of columns is preferably substantially identical to the first pair of columns and arranged to be parallel thereto. A pair of flanges extend from opposite sides of the support plate with the flanges being configured to receive fasteners for mounting the support plate to a pair of wall studs.

An appreciation of the objectives of the present invention and a more complete understanding of its structure and method of operation may be had by studying the following description of the preferred embodiment and by referring to the accompanying drawings.

DETAILED DESCRIPTION OF THE INVENTION

Figure 1A:
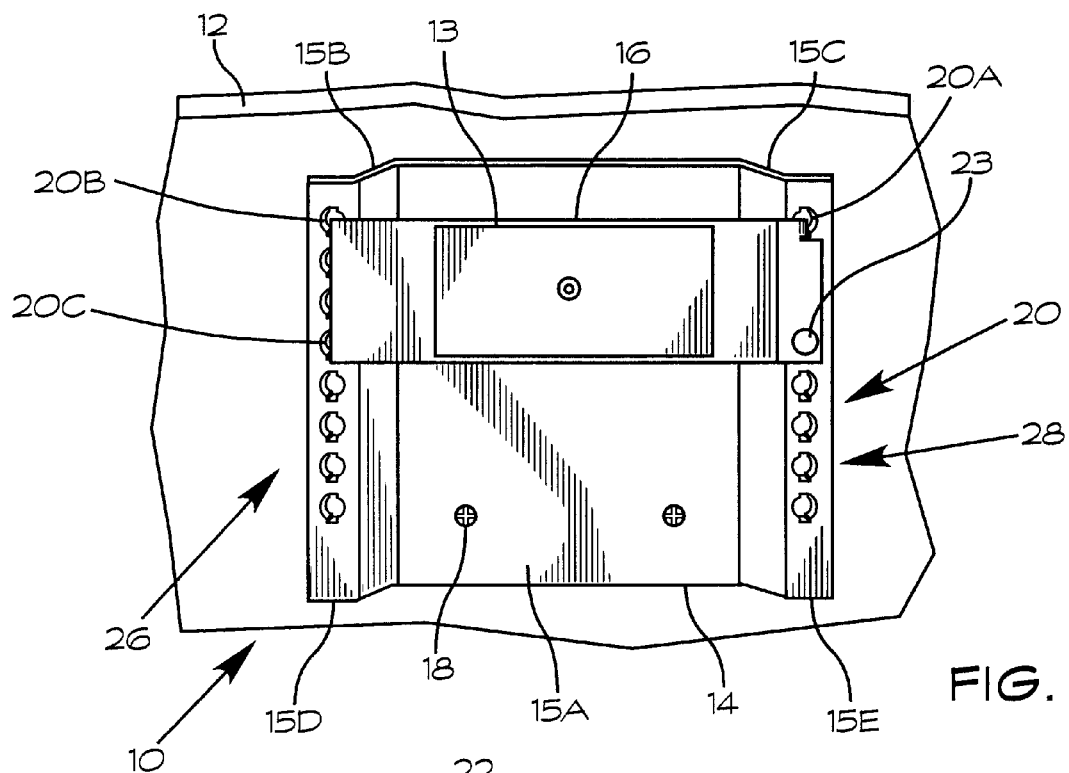
FIG. 1A is a front perspective view of a wall mounted electronics component mounting system according to the present invention including a module an support panel.
Figure 2:
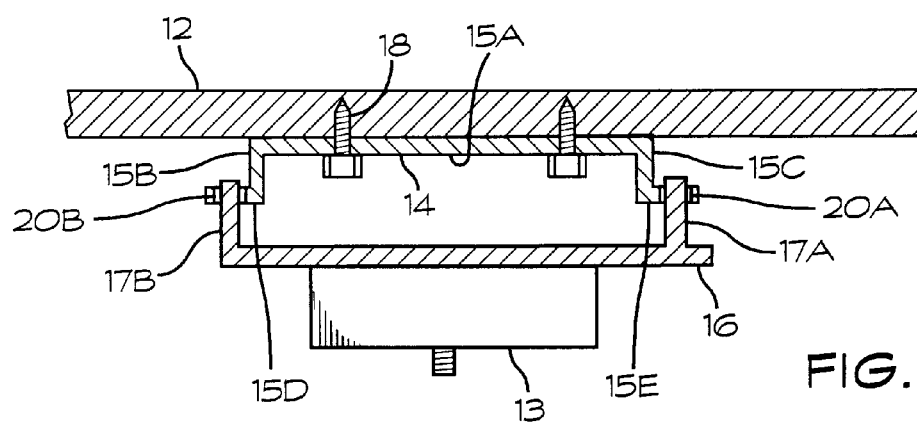
FIG. 2 is a top plan view of the apparatus of FIG. 1.

FIGS. 1A and 2 show a modular electronics component mounting system 10 according to the present invention mounted to a wall 12. The modular electronics component mounting system 10 includes a support panel 14 and one or more modules 16 arranged to have one or more electronic components 13 mounted thereto. The modules 16 may be arranged so they are vertically aligned. The support panel 14 and module 16 may be formed of metal or a suitably strong plastic such as polycarbonate. The support panel 14 is mounted to the wall 12 by a plurality of fasteners 18, such as screws or the like. It may be necessary to use anchoring devices (not shown) with the fasteners 18, depending on the composition of the wall.

Figure 1B:
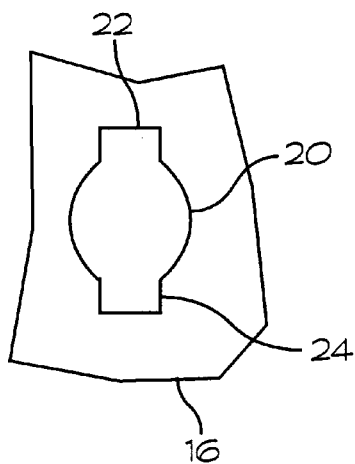
FIG. 1B is a front elevation view showing a mounting hole that may be included in the support panel of the FIG. 1.

The support panel 14 includes an array of holes 20 arranged in a predetermined grid pattern. The holes 20 preferably are generally round in shape with rectangular notches or slots 22 at the upper portions and similar notches 24 at the bottom portions. FIG. 1B shows an enlarged front elevation of one of the holes 20. The holes preferably are about 0.25" wide and 0.30" high. The rectangular notches preferably are about 0.10: wide.

The grid pattern has a first column 26 of the holes 20 with a vertical spacing of about 0.5" between adjacent holes. The grid pattern has a second column 28 that is essentially identical to the first column 26. The columns are arranged to be parallel and spaced apart by about 6.0".

The support panel 14 has a generally flat central section 15A. At the sides of the central section 15 a pair of flanges 15B and 15C extend away from the central section 15A. The flanges 15B and 15C provide means for spacing portions 15D and 15E away from the wall 12. The holes 20 are formed in the portions 15D and 15E so that the holes 20 are also spaced away from the wall 12. In a typical installation, the back of the support panel is spaced apart from the wall 12 by about 0.3".

Figure 5:
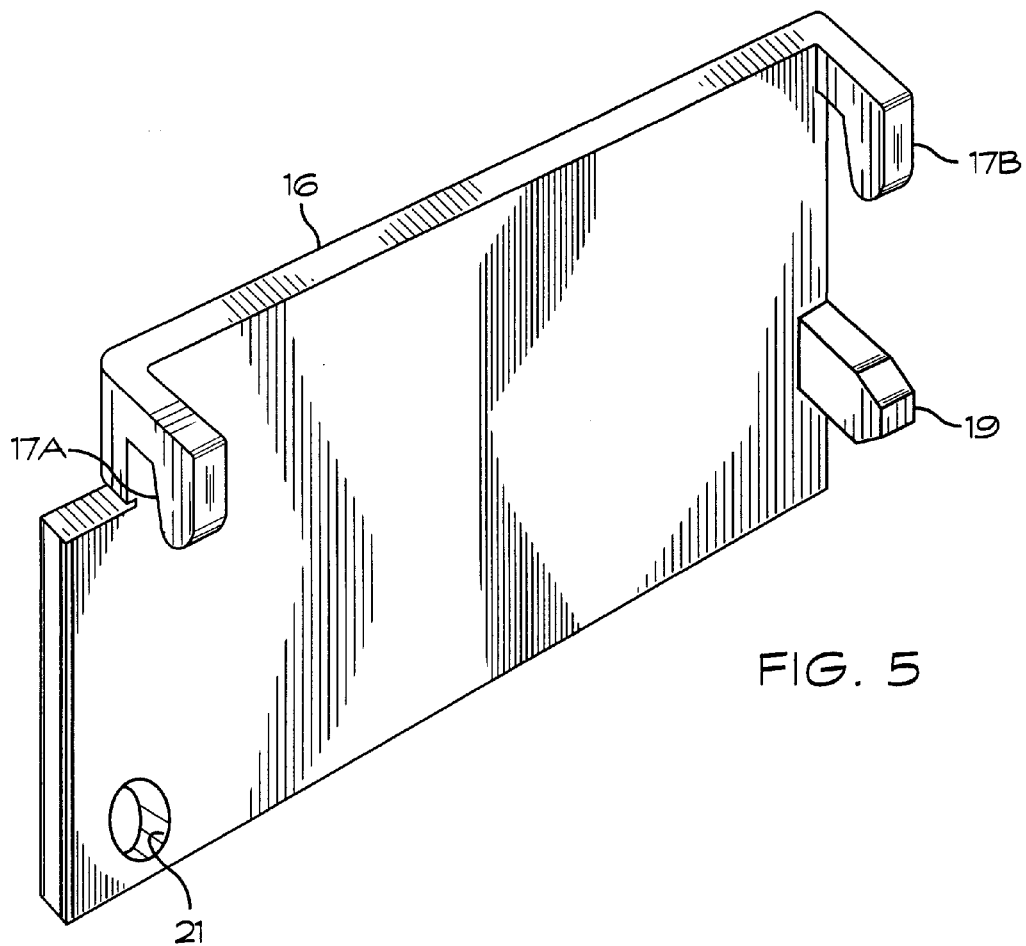
FIG. 5 is a perspective view showing the back side of a module that may be included in the electronics component mounting system according to the present invention.

FIG. 5 shows the back side of the module 16. As shown in FIG. 5, at the top of the module 16 there are a pair of hooks 17A and 17B that are configured to be inserted into a corresponding pair of the holes 20A and 20B. A locking pin 19 extends from the lower portion of the back side of the module near corner. The locking pin 19 is in vertical alignment with the hook 17B. The vertical spacing between the hook 17B and the locking pin 19 is selected so that when the hook 17B is in the hole 20B, the locking pin extends into a hole 20C in the rear panel.

At the lower portion of the other side of the module 16, there is a hole 21 in vertical alignment with the hook 17A. The bole is arranged to receive a snap latch 23. When the module 16 is attached to the rear panel, the snap latch 23 extends through the hole 21 into the adjacent bole 20D in the array of holes 20 in the rear panel. The snap latch is engaged with the edges of the hole 20D to retain the module 16 in position on the support panel 14. The snap latch 23 is preferably a commercially available item that may be selectively engaged and disengaged from the support panel 14.

Figure 6:
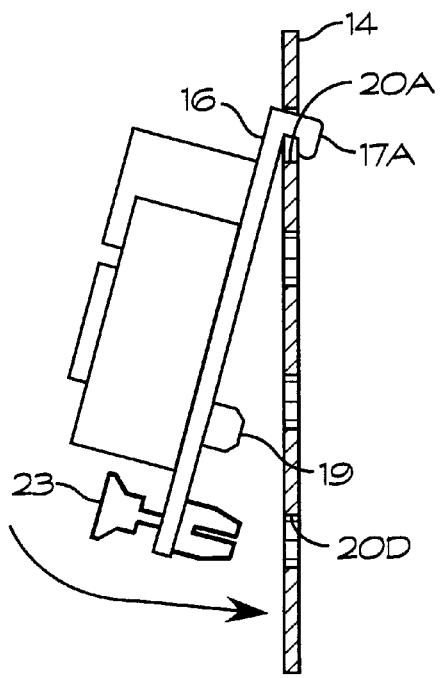
FIG. 6 is a right side elevation view of an electronics component mounting system according to the present invention shown being mounted to the rear panel.
Figure 7:
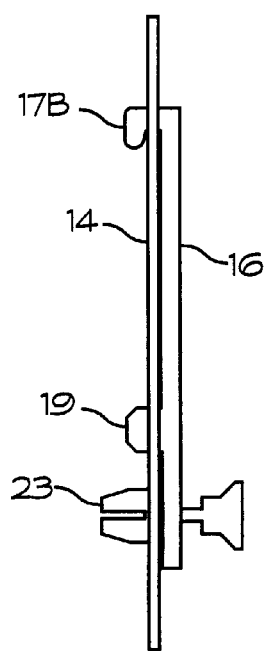
FIG. 7 is left side elevation view of an electronics component mounting system according to the present invention showing the module connected to the rear panel.

FIG. 6 illustrates the technique for mounting the module 16 to the support panel 14. The hooks 17A and 17B are identical and allow the module 16 to hang from the top when the hooks 17A and 17B are engaged in the holes 20A and 20B, respectively. The snap latch 23 is arranged to prohibit the latch side of the module 16 from moving upward and allowing the hooks 17A and 17B to disengage from the edges of the holes 20A and 20B, respectively. The snap latch 23 also holds the module 16 flat against the support plate, keeping the locking pin 19 from disengaging from the edges of the hole 20C, which keeps the hook 17A engaged.

Attaching the module 16 to the support plate involves inserting the hooks 17A and 17B into holes 20A and 20B, respectively, at the same level and then swinging the module 16 downward so the latch 19 and locking pin 23 penetrate their corresponding holes in the grid. The center pin of the latch 23 is then depressed to lock the latch 23 in place in the hole 21.

Figure 3:
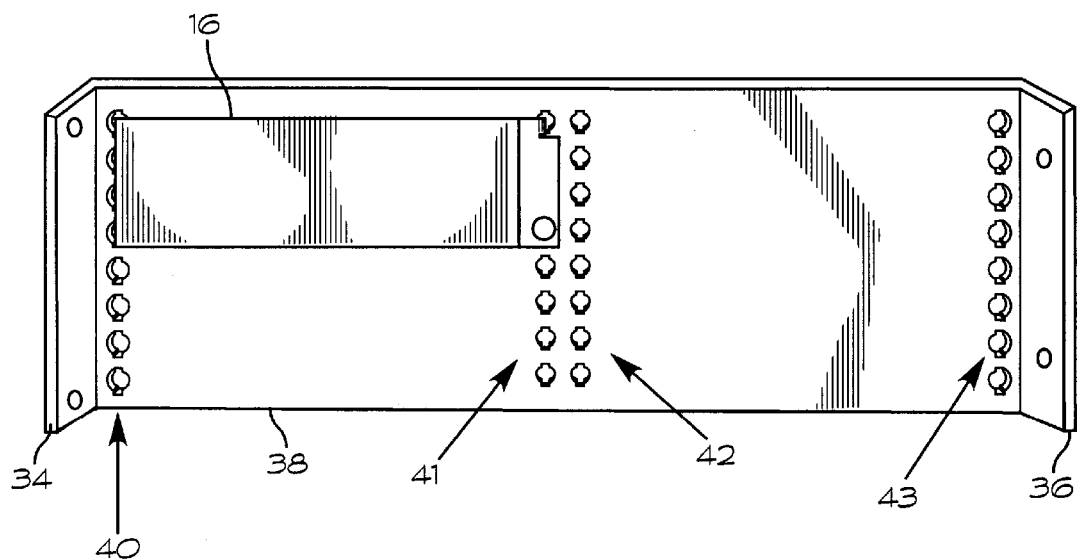
FIG. 3 is a front perspective view of a second embodiment of a an electronics component mounting system according to the present invention shown mounted between two wall studs.
Figure 4:
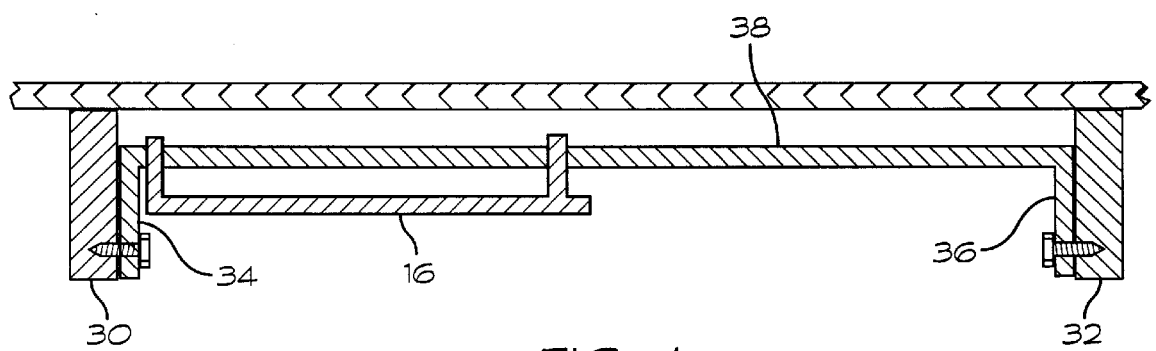
FIG. 4 is a top plan view of the embodiment of the invention shown in FIG. 3.

FIGS. 3 and 4 show an embodiment of the invention configured for mounting between a pair of wall studs 30 and 32. Flanges 34 and 36 extend from the ends of a rear plate 38. The flanges 34 and 36 include suitable mounting holes for receiving screws or nails that may be used to secure the rear plate 38 to the studs 34 and 36.

The rear plate 38 has four parallel columns 40–43 of mounting holes arranged so that a pair of front plates 46 and 48 may be mounted side-by-side. Additional front plates (not shown) may be mounted to the rear plate with the front plates being arranged in a pair of parallel columns.

There are several benefits of this mounting system according to the present invention. It is inherently inexpensive because it may be formed from sheet-metal with only basic metal working techniques used to implement the mounting apparatus. In addition, none of the mounting details are of critical tolerance. The single latch mechanism is inexpensive, self-retaining, and may be operated without tools. Although the width of the modules 16 must be controlled, the height may be increased almost arbitrarily in 0.5" increments because of the 0.5" vertical spacing between the holes in the grid pattern. The modules 16 may be mounted in any order and may abut one another. Unlike the DIN-rail system, the grid according to the present invention is very broad, with a large contact area. The force of a punch-down tool used to attach wires to a telecommunications type connector will be directly transferred to the grid. The invention is simple to use in that no tools are needed to attach the modules to the support panels.

The invention is also position insensitive. Because the details of the grid are identical side-to-side, the modules may be inserted upside down. In this case, the latch and locking pin will bear the weight of the device, which is acceptable with most products envisioned for this type of enclosure.

The invention further provides true modularity. Each home will present different needs. The size of the house, number of wall-plates and types of services supported will be unique on a home by home basis. The ability to respond to each home's needs requires a system to not impose arbitrary solutions. For example some manufactures of similar systems have a special place to mount a coax distribution panel. There is no provision to service a home requiring a greater number of TV drops than this panel provides. Perhaps the panel requires no coax support, as in the case of a panel installed just to service in-wall speakers. In this case, a special mounting scheme for the coax panel may prohibit mounting another type of device in this location. Nonmodular mounting schemes can be restrictive or inefficient.

The structures and methods disclosed herein illustrate the principles of the present invention. The invention may be embodied in other specific forms without departing from its spirit or essential Characteristics. The described embodiments are to be considered in all respects as exemplary and illustrative rather than restrictive. Therefore, the appended claims rather than the foregoing description define the scope of the invention. All modifications to the embodiments described herein that come within the meaning and range of equivalence of the claims are embraced within the scope of the invention.

What is claimed is:

1. Apparatus for mounting an electronic component to a wall of a structure such as a home or an office, comprising:

a support panel, the support panel including a grid of holes therein, the grid being formed to have a pair of columns of the holes, the columns being spaced apart by a selected distance and the holes in each of the columns being spaced apart by a predetermined interval;

means for mounting the support panel to the wall, the support panel being formed such that the grid is spaced apart from the wall when the support panel is mounted thereto;

a module formed generally as a plate such that an electronic component may be mounted thereto, the module including:

a pair of hooks extending from a first edge thereof, the hooks being spaced apart by the column spacing such that the hooks may be arranged to extend through corresponding first and second holes in the grid;

a locking pin extending from the module such that the locking pin extends into a corresponding third hole in the grid to restrain the module against movement parallel to the support panel; and the module further including a hole that is aligned with a fourth hole in the grid when the hooks and locking pin are in their respective holes; and a snap latch configured for insertion into the hole and through the fourth hole in the grid, the snap latch being arranged to restrain the module against movement away from the support panel.

2. The apparatus of claim 1 further comprising:

a second pair of columns of holes formed in the support panel, the second pair of columns being substantially identical to the first pair of columns and arranged to be parallel thereto; and a pair of flanges extending from opposite sides of the support panel, the flanges being configured to receive fasteners for mounting the support plate to a pair of wall studs.

3. The apparatus of claim 1 wherein the pair of hooks extend from an upper edge of the module so that the module hangs from the pair of hooks when they are inserted into the corresponding first and second holes.

4. The apparatus of claim 1 wherein the holes are substantially identical.

5. The apparatus of claim 4 wherein each of the holes in the grid is formed to be round with vertically aligned slots being formed at upper and lower portions.

6. The apparatus of claim 5 wherein the slots are formed to provide generally rectangular portions at the upper and lower edges of the holes.

7. The apparatus of claim 1 wherein the pair of hooks and the locking pins extend directly from the plate.

* * * * *